United States Patent [19]

Ross

[11] Patent Number: 4,849,081

[45] Date of Patent: Jul. 18, 1989

[54] FORMATION OF OXIDE FILMS BY REACTIVE SPUTTERING

[75] Inventor: Randall G. Ross, Escanaba, Mich.

[73] Assignee: The BOC Group, Inc., New Providence, N.J.

[21] Appl. No.: 209,766

[22] Filed: Jun. 22, 1988

[51] Int. Cl.[4] .................... C23C 14/34; C23C 14/08
[52] U.S. Cl. .................... 204/192.15; 204/192.16; 204/192.22; 204/192.23; 204/192.26; 204/192.29
[58] Field of Search .................... 204/192.15, 192.16, 204/192.22, 192.23, 192.26, 192.27, 192.28, 192.29

[56] References Cited

U.S. PATENT DOCUMENTS 3,477,936 11/1969 Gillery et al. .................... 204/192.29

OTHER PUBLICATIONS

W. D. Münz et al., *Thin Solid Films*, vol. 86, pp. 175–181.
J. S. Logan et al., *IBM Tech. Disc. Bull.*, vol. 14, No. 12, May 1972, p. 3690.
G. L. Harding, "High Rate DC Reactively Sputtered Metal-Oxy-Fluorine Dietric Material", *Thin Solid Films*, vol. 136, pp. 279–287 (1968).

*Primary Examiner*—Aaron Weisstuch

[57] ABSTRACT

In reactive sputtering of silicon, titanium, aluminum or tin in an oxygen-containing atmosphere to deposit a layer of the corresponding oxide on a substrate, the deposition rate is markedly enhanced by addition of chlorine to the atmosphere. The resulting films contain at most minor amounts of chlorine, so that mechanical, chemical and optical properties of the films are not substantially altered by use of chlorine in the process.

17 Claims, 1 Drawing Sheet

FORMATION OF OXIDE FILMS BY REACTIVE SPUTTERING

BACKGROUND OF THE INVENTION

The present invention relates to methods of forming oxide films by reactive sputtering.

Thin oxide films are used as coatings on optical elements such as lenses, mirrors and window panes. These thin films can be used in known fashion to provide particular mechanical, chemical and optical properties. In certain applications, it is desirable to provide a film of a substantially pure oxide such as titanium dioxide, silicon dioxide, tin dioxide or aluminum oxide. Such substantially pure oxide films offer good resistance to mechanical abrasion, resist degradation by moisture in the environment and provide films with indices of refraction ranging from 1.45 ($SiO_2$) to 2.40 ($TiO_2$). Accordingly, a substantially pure oxide film may be utilized as an exposed surface of an optical element. For example, a window pane may be provided with a multilayer coating incorporating layers of titanium dioxide and layers of silicon dioxide in an alternating arrangement to provide transmission and reflection of light at particular wavelengths.

Pure oxide films may be deposited by a process known as reactive sputtering. In sputtering, the item to be coated or "substrate" is placed adjacent a source of material to be deposited, commonly referred to as a "target". The target is exposed to a plasma or ionized gas and the target is placed at a negative electrical potential with respect to the plasma. Under these conditions, ions from the plasma strike the target with considerable energy and dislodge material from the target. The dislodged material deposits on the substrate to form the coating. Ordinarily, the entire sputtering process is conducted within a chamber maintained at a low, subatmospheric pressure. In reactive sputtering, the plasma contains a reactive constituent which combines with the material of the target so that the deposited coating includes both the material from the target and the reactive constituent from the plasma. Thus, oxide coatings are commonly formed by reactive sputtering utilizing a target containing a metalloid such as silicon or a metal such as titanium, tin or aluminum together with a plasma containing oxygen. The oxygen in the plasma combines with the metal or metalloid dislodged from the target, and the coating deposited on the substrate is an oxide of the metal or metalloid.

Reactive sputtering processes according to this general scheme can provide high quality, substantially pure oxide films. However, the speed of the sputtering processes employed to deposit oxide films heretofore has been limited. The cost of applying a particular film by the sputtering process is directly related to the time required for the process. Accordingly, considerable effort has been expended heretofore in the refinement of the reactive sputtering process to enhance its speed. Although considerable progress has been made heretofore, there has been, nonetheless, a long felt need for a reactive sputtering process capable of depositing a high quality, substantially pure oxide film at higher speed.

It has been known heretofore that films including metal, oxygen and fluorine can be deposited by a reactive sputtering process utilizing an atmosphere containing both oxygen and fluorine. Such processes are disclosed in U.S. Pat. No. 3,477,936 and in Harding, "High Rate DC Reactively Sputtered Metal-Oxy-Fluorine Dielectric Materials", *Thin Solid Films*, Vol. 138 (1986) 279–287. Harding noted that such a deposition process proceeds at a relatively rapid rate. However, the fluorine-containing films made by these processes have optical, mechanical and chemical properties differing from the properties of the pure oxides. These references do not teach that their processes can provide substantially pure oxide films.

SUMMARY OF THE INVENTION

One aspect of the present invention provides a method of depositing an oxide film. A method according to this aspect of the invention most preferably includes the steps of providing a target including a metal or metalloid element selected from the group consisting of Si, Ti, Al, Sn and combinations thereof, providing a substrate in proximity to the target and exposing the target to a plasma while maintaining the target at a negative potential with respect to the plasma. The plasma most preferably contains both oxygen and chlorine.

This aspect of the present invention incorporates the realization that inclusion of chlorine in the plasma employed in a reactive sputtering process can provide a marked increase in the deposition rate without appreciably impairing the quality of the deposited film. Thus, the films deposited in preferred processes according to this aspect of the invention are substantially pure oxide films, and contain at most insignificant amounts of chlorine, on the order of a few atomic percent or less. Oxide films made by preferred processes according to this aspect of the present invention have substantially the same properties as oxide films formed by conventional reactive sputtering processes. Processes according to this aspect of the invention can be conducted under conditions similar to those employed for the conventional reactive sputtering process. However, preferred processes according to this aspect of the invention provide deposition rates which may be twice those achieved in the corresponding, conventional reactive sputtering process and, in some cases, as much as thirty times those achieved in the corresponding conventional process.

The present invention is not limited by any theory of operation. However, it is believed that the enhanced deposition rate achieved in preferred processes according to the present invention results at least in part from a reaction between monatomic or ionic chlorine in the plasma and the metal or metalloid of the target to form volatile molecules or radicals at the target surface. It is believed that these volatile species are particularly susceptible to dislodgement from the target surface under the influence of the bombarding ions from the plasma.

The plasma may contain a noble gas or group VIII constituent, most preferably argon, in addition to oxygen and chlorine. The step of exposing a target to a plasma may include the step of providing the plasma-forming gas and converting the gas to a plasma as by an electrical discharge so that the plasma is present in proximity to the target. The plasma-forming gas may include at least one gaseous species containing oxygen and chlorine. Desirably, separate oxygen-containing and chlorine-containing species are provided. The chlorine-containing species preferably is a compound containing carbon and chlorine, such as a chlorinated hydrocarbon. $CCl_4$ is a particularly preferred chlorine-containing species. $O_2$ is a particularly preferred oxygen-containing species.

The deposition rate may be enhanced by substantially isolating the substrate upon which the film is deposited from the plasma, as by confining the plasma to the immediate vicinity of the target.

A further aspect of the present invention provides apparatus for performing processes in accordance with the invention. Apparatus according to this aspect of the present invention may include means for holding a target and a substrate in proximity to one another, means for exposing the target to a plasma containing both oxygen and chlorine and means for maintaining the target at a negative sputtering potential with respect to the plasma. The plasma exposing means may include means for providing a plasma-forming gas containing both oxygen and chlorine.

These and other objects, features and advantages of the present invention will be more readily apparent from the detailed description of the preferred embodiment set forth below taken in conjunction with the accompanying drawing.

DETAILED DESCRIPTION OF THE PREFERRED EMBODIMENTS

Figure 1:
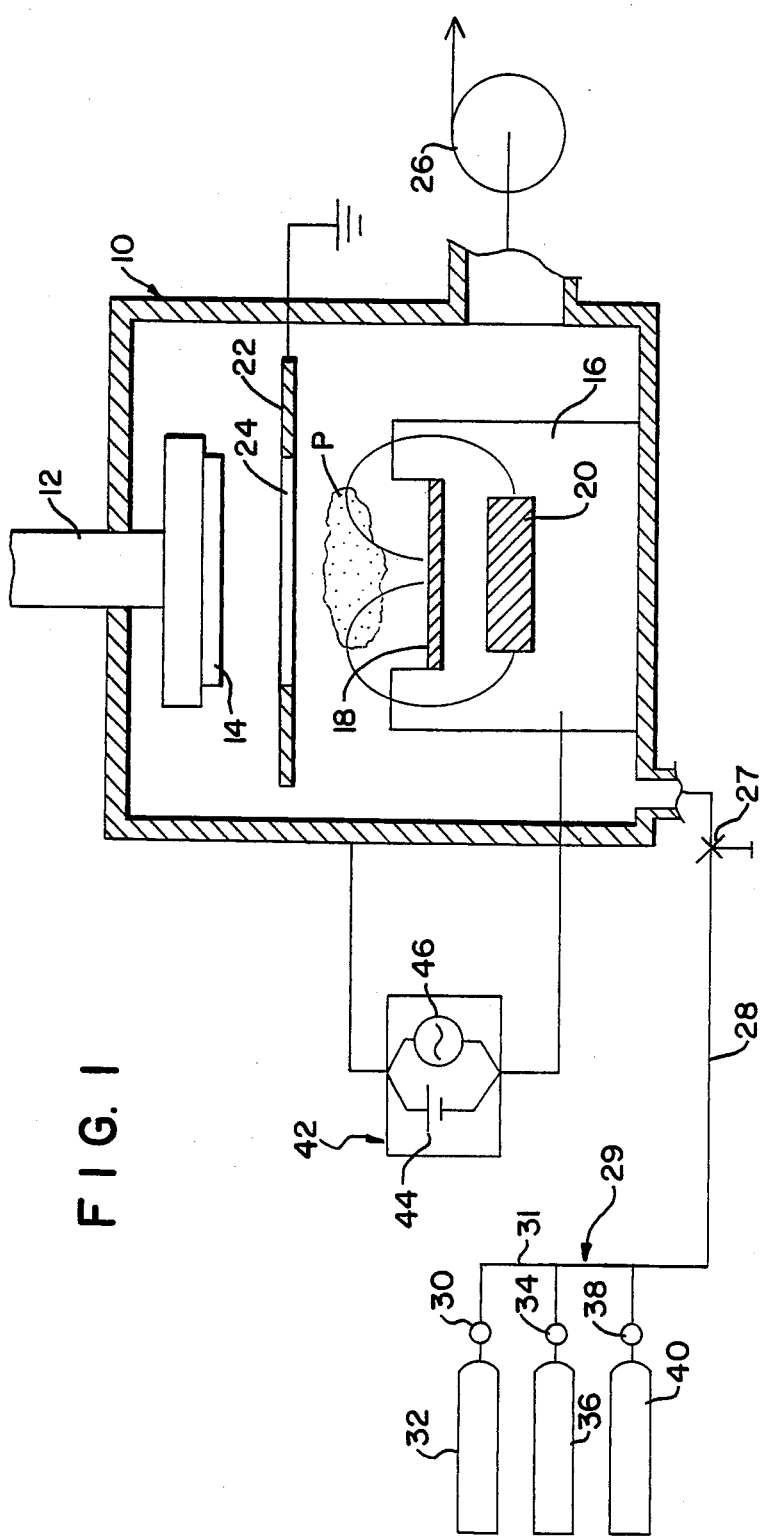
FIG. 1 is a schematic view of apparatus in accordance with one embodiment of the invention.

Apparatus in accordance with one embodiment of the present invention incorporates a sputtering chamber 10. A substrate support 12 is mounted within chamber 10. The substrate support may incorporate appropriate heating and/or cooling features such as fluid channels and the like (not shown). Substrate support 12 is adapted to retain a substrate 14 to be coated with a film. Thus, the substrate support may include conventional devices such as clamps and fixtures (not shown) for holding the substrate so that the surface to be coated is exposed. Chamber 10 also includes a target support 16, which also may be provided with appropriate heating and/or cooling channels. Target support 16 is adapted to hold target 18 in proximity to substrate support 12 and substrate 14 so that an exposed face of the target confronts the exposed face of the substrate but is spaced therefrom. Thus, the target support may also include appropriate clamps or fixtures. A conventional magnetic field generating device 20 is mounted adjacent target support 16 so that the magnetic field produced by field generator 20 extends in the immediate vicinity of the exposed face of the target 18. The target support and magnetic field generating device may be a conventional device commonly referred to as a planar magnetron. An electrically grounded, conductive shield 22 is disposed between target support 16 and substrate support 12. The shield has an aperture 24 disposed in alignment with the target holder 16 and substrate holder 12, so that the aperture is disposed between the confronting faces of the target 18 and substrate 14.

Appropriate doors and pass-through devices (not shown) are provided in the wall of chamber 10 to permit insertion and removal of substrates 14 and targets 18. The interior of chamber 10 is connected to a conventional vacuum pumping system 26 appropriate for handling reactive gasses such as oxygen and chlorine. Chamber 10 is also connected to a gas inlet pipe 28 equipped with a throttling valve 27. Inlet pipe 28 is connected to apparatus 29 for supplying a plasma-forming gas.

Gas supply apparatus 29 is arranged to supply a plasma-forming gas which includes chlorine and oxygen, and which may also include a noble gas. The plasma-forming gas may optionally include carbon as well. As further discussed below, multiatomic gas molecules in the plasma-forming gas supplied by apparatus 29 will be partially or completely dissociated to their constituent atoms and ions thereof within chamber 10. Accordingly, the plasma-forming gas supplied by source 29 may incorporate substantially any gas species which include the desired elements either in pure form or as compounds. Thus, the plasma-forming gas desirably includes one or more gaseous species incorporating oxygen and chlorine and also includes with any noble gas to be included in the plasma. The oxygen and chlorine may be supplied as a single compound, but more preferably are supplied as two or more gaseous constituents of differing compositions so as to permit adjustment of the proportion of chlorine to oxygen in the plasma. One or both of the gaseous constituents which includes oxygen or chlorine or both may also include carbon. Chlorine and carbon may be provided as a single compound. The constituents of the plasma-forming gas need not include appreciable quantities of hydrogen or fluorine, and may be substantially devoid of these elements. Preferred chlorine-containing gaseous species include volatile, low molecular weight, chlorinated organic compounds. Fully chlorinated saturated or unsaturated hydrocarbons having 4 or fewer carbon atoms are particularly preferred. Of these, $CCl_4$ is most preferred. $O_2$ is the most preferred oxygen-containing gaseous species. Any of He, Ne, Ar, Kr and Xe may be employed as the noble gas, but Ar, Kr and Xe are preferred and Ar is particularly preferred.

Gas supply apparatus 29 includes gas-handling components such as a manifold 31 connected through a flow regulating valve 30 to a source 32 of a noble gas such as a tank containing the noble gas. Manifold 31 is further connected via a further flow regulating valve 34 to a source 36 of an oxygen-containing gaseous species. Additionally, manifold 31 is connected by yet another flow regulating valve 38 to a source 40 of a chlorine-containing gaseous species which also includes carbon. Valves 30, 34 and 38 can also be adjusted to vary the composition of the gas supplied to inlet pipe 28. Pumping system 26 and throttling valve 27 are arranged to maintain chamber 10 under a low, subatmospheric pressure, and to regulate the flow of gases into and out of the chamber. Appropriate, conventional instrumentation and control equipment (not shown) of the type normally utilized in high vacuum systems is provided for sensing the pressure within the chamber and adjusting the pumping device and throttling valve to maintain the desired pressure and flow rate.

A conventional sputtering power supply 42 including a source of DC potential 44 and a source of alternating electrical potential 46 is associated with chamber 10. Power supply 42 is connected to the chamber wall and also connected to target support 16. Power supply 42 is arranged to apply a DC potential, an alternating potential such as a radio frequency or "RF" potential or a combination of the DC and alternating potentials between the wall of chamber 10 and target support 16.

A process according to one embodiment of the invention utilizes a target 18 in the form of a slab of a metal or metalloid selected from the group consisting of Sn, Ti, Al or Si, or a combination of these elements as an alloy, mixture or mosaic. The target is mounted in target support 16. A substrate to be coated, such as a glass optical element, window pane or the like is mounted to substrate holder 12 and chamber 10 is then closed. Gas supply apparatus 29 and pump 26 are actuated to purge the interior of the chamber with the plasma-forming gas mixture and to bring the interior of the chamber to the desired pressure. The absolute pressure in the chamber preferably is less than about 100 mTorr, more preferably between about 0.1 mTorr and 20 mTorr and most preferably between about 1 mTorr and 10 mTorr. Power supply 42 is actuated to apply an electrical potential between the substrate support 16 and the wall of chamber 10, and hence to apply a potential between target 18 and the chamber wall. The applied potential causes ionization of the plasma-forming gas, thereby converting the gas within chamber 10 to a plasma. Where a DC potential is applied, its polarity is selected so that the target holder 16 and target 18 are negative with respect to the chamber wall and hence are at a negative potential with respect to the plasma. Where an alternating potential such as an RF potential is applied, the rectifying effect of the plasma itself causes the target to assume a negative potential with respect to the plasma. The applied potential is selected to maintain an electrical discharge adjacent to target 18 and hence to maintain a stable plasma adjacent the exposed face of the target. Ions in the plasma are accelerated under the influence of the applied potential towards target 18. These ions collide with atoms and molecules of the plasma-forming gas. These collisions create additional ions and electrons and also cause dissociation of gas molecules. The magnetic field from source 20 alters the paths traversed by electrons so as to increase the number of collisions and generate more ions, electrons and radicals. Thus, the magnetic field facilitates maintenance of a stable plasma in the region of the chamber adjacent the target according to the known magnetron effect.

Ions from the plasma impact on the exposed surface of target 18, so that material is continually sputtered or dislodged by these impacting ions from the exposed target surface. Also, constituents of the plasma undergo chemical reactions with the target material at the surface. Although the present invention is not limited by any theory of operation, it is believed that these chemical reactions result in formation of volatile compounds or radicals of the metal or metalloid in the target. These compounds or radicals are believed to contain chlorine as a constituent. Thus, it is believed that the volatile compounds formed at the surface have lower latent heats of sublimation and/or vaporization than the pure metal or metalloid of the target. It is therefore believed that the volatile compounds formed at the target surface in the presence of chlorine are particularly susceptible to sputtering or dislodgement by bombarding ions (referred to as chemically-enhanced physical sputtering) and are also susceptible to dislodgement by conventional evaporation or dislodgement by the thermal vibration energy present in the system (referred to as chemical sputtering). Regardless of the actual mechanism of the operation, the net effect is to dislodge material from the exposed surface of target 18. Ordinarily, the rate of dislodgement is not uniform over the exposed surface of the target. Thus, some areas of the target surface may be subject to more intense sputtering than others. With typical magnetron apparatus, the most intense sputtering occurs in an annular zone on the target surface.

The dislodged metal or metalloid from target 18 is deposited on substrate 14 as an oxide of the metal or metalloid, thus forming an oxide film on the substrate. Here again, the present invention is not limited by any theory. However, it is believed that the dislodged material undergoes further chemical reaction in transit from the target to the substrate or upon deposition on the substrate surface. It is thus believed that chlorine-containing compounds are converted to oxides, and that any pure metal or metalloid dislodged from the target surface is likewise converted to the oxide. Moreover, it is believed that the oxides have a substantially greater latent heat of vaporization than the chlorine-containing metal compounds. Accordingly, the oxides tend to deposit at the substrate surface whereas any chlorine-containing species tend to remain in the vapor phase. Regardless of the actual mechanism of operation, the net result is to deposit an essentially pure film of an oxide of the target metal or metalloid onto the substrate, such that the film contains at most minor amounts of chlorine. The deposited film typically contains less than about 10 atomic percent chlorine, preferably about 5 atomic percent chlorine or less and more preferably less than about 4 atomic percent chlorine. The deposited film typically has optical, mechanical and chemical properties such as index of refraction, scratch resistance and environmental moisture resistance comparable to a pure film of the same oxide.

Substrate 14 is substantially isolated from the ionized species in the plasma. Because power supply 42 is connected to target support 16 and not to substrate support 12, the electrical discharge occurs principally in the vicinity of the target. Moreover, the ionization promoting effects of the magnetic field are present only in the vicinity of the target and not in the vicinity of the substrate. Therefore, essentially all of the ions in the system are formed in the vicinity of the target, remote from the substrate. Because the electric fields in the system tend to draw positive ions towards the target rather than towards the substrate, relatively few ions reach the substrate. Further, the grounded shield 22 tends to suppress stray electromagnetic fields in the vicinity of the substrate, and hence to prevent unwanted ionization of the gas in the vicinity of the substrate. All of these factors tend to isolate the substrate from ions in the plasma.

To achieve the greatest rate of film deposition on the substrate, it is generally desirable to apply the maximum possible electrical power within the limits of the system. These limits may be set either by the capacity of power supply 42 or more typically by limitations on heat transfer from target 18. Thus, some of the energy of the bombarding ions is converted to heat at target 18. This heating effect, and hence the temperature of the target increases with the applied power. Accordingly, the applied power normally is limited so as to avoid melting of the target.

The amount of oxygen in the system should be at or above the minimum or threshold level required for so-called "oxide regime" operation, i.e., at or above the minimum amount of oxygen required to maintain a film of oxidized material on the areas of the target surface subject to the most intense sputtering. The exposed surface of the target is continually eroded by sputtering and evaporation. Below the threshhold oxygen concentration, the rate of oxide formation is less than the rate of erosion in those areas of the target subject to the most intense sputtering. Thus, in these areas the surface of the target has little or no oxide thereon. Above this threshhold, oxide is formed as rapidly as new metal or metalloid is exposed by erosion, so that there is distinct oxide layer on the exposed areas of the target subjected to the most intense sputtering.

The threshhold oxygen concentration necessary for oxide regime operation will depend upon variables such as the physical configuration of the system, the applied power level and the amount of chlorine present. For any given system, the threshhold level can be determined by any of several methods. Trial runs can be conducted at various oxygen concentrations, and each trial run can be interrupted after attaining equilibrium operating conditions. The presence or absence of an oxide film in the sputtered regions can then be determined by direct or instrumental observation. Also, operation in the oxide regime requires a different negative potential on the target to provide the same sputtering power input than does operation below the threshold. Thus, the process can be operated at varying oxygen levels while maintaining the sputtering power input constant and measurements of the voltage on the target may be taken by conventional means. These measurements typically show a significant change in the cathode voltage as the threshold is crossed. There is typically some hysteresis effect in a measurement sequence of this type. Thus, voltage measurements taken with progessively decreasing oxygen concentrations may indicate a threshhold oxygen concentration slightly less than the threshhold obtained with a sequence of progressively increasing oxygen concentrations. The higher value of oxygen concentration should be taken as the correct threshold. Alternatively, the spectrum of optical emissions from the target surface may be analyzed. Where the process is operating in the oxide regime, there will be substantial spectral lines indicative of oxides on the surface. Where the process is operating below the threshold, such lines will be greatly reduced and there will be substantial spectral lines indicative of the pure metal or metalloid of the target.

Operation at oxygen concentrations far below the threshhold is less preferred. Although reasonably high deposition rates can be achieved in this oxygen-poor or "metal" sputtering regime, the films formed tend to contain incompletely oxidized metal and are thus optically absorbing. The process can be conducted at any oxygen concentration above the threshhold while still maintaining proper film quality. Thus, the plasma-forming gas may consist entirely of oxygen and the chlorine-containing gaseous constituent. In some systems, however, inclusion of a noble gas such as argon is beneficial. Thus, in some systems the number of atoms dislodged from a typical target by an impacting oxygen ion is less than the number of atoms dislodged by an impacting ion of a noble gas such as argon under the same sputtering conditions. In these systems, it is desirable to use an oxygen concentration just slightly above the threshhold level required for oxide mode operation, and to include some noble gas, most preferably argon, in the plasma-forming gas.

The chlorine content of the plasma and hence the amount of chlorine-containing gas constituent in the plasma-forming gas may be selected to provide the maximum deposition rate. For any given system, with a particular target, power input level and oxygen concentration and with particular physical configuration, the deposition rate generally increases as the chlorine content of the plasma forming gas increases, reaches a maximum at a particular optimum chlorine concentration and decreases at chlorine concentrations above the optimum. Here again, the present invention is not limited by any theory of operation. However, it is believed that there is some etching of the deposited oxide film by chlorine in the system. This may occur by the formation of volatile compounds including the metal or metalloid at the deposited film and by evaporation or sputtering of these compounds from the substrate surface. In effect, there may be a reverse deposition process which removes material from the substrate and thus reduces the net rate of deposition. Chlorine concentrations other than the optimum concentration may be employed. However, such non-optimum chlorine concentrations will provide lower net deposition rates and hence are less preferred. Moreover, chlorine concentrations far above the optimum tend to cause incorporation of more chlorine in the deposited films.

The process will operate with either DC or alternating power such as RF power. RF power is preferred especially for silicon and aluminum targets because RF power exhibits less of a tendency to provoke arcing on the target surface. The process will operate satisfactorily over a wide range of substrate temperatures. Preferably, the substrate is at about room temperature (20° C.) or above, but below the temperature required to damage the substrate. The purity of the deposited film typically is enhanced by operation at high substrate temperatures. The substrate temperature may be controlled directly by heating or cooling devices associated with the substrate support or indirectly by controlling process parameters such as sputtering power and substrate speed.

As will be appreciated from the foregoing description of the factors involved in selection of process conditions, the process conditions may be expected to vary considerably with the particular equipment employed. However, the conditions shown in Table I below give generally useful results in typical sputtering equipment:

TABLE I

| Target | Gas Flow* sccm/cm$^2$ | Gas Composition | | Power Type | Sputtering Input | |
| | | $O_2$ mole % | $CCl_4$ mole % | | Potential (volts) | Power* KW/cm$^2$ |
| --- | --- | --- | --- | --- | --- | --- |
| Si | 1.75 | 43 | 57 | RF | −390 | .0085 |
| Al | 0.57 | 89 | 11 | DC | −370 | .02 |
| Ti | 0.60 | 63 | 37 | DC | −712 | .06 |
| Sn | 0.55 | 76 | 24 | DC | −565 | .02 |

*Based on the surface area of the actively sputtered "racetrack" region of the target.

Numerous variations and combinations of the features described above can be employed without departing from the present invention as defined by the claims. The physical configuration of the sputtering chamber can be modified substantially to incorporate any or all the features commonly found in sputtering chambers used for typical reactive sputtering processes. The grounded shield may be omitted. The sputtering chamber may incorporate a conveyor such as a set of rollers as a substrate support, and may incorporate appropriate interlocks for continuously or semi-continuously moving successive substrates through the chamber. Also, the chamber may include a plurality of sputtering zones, with different targets and/or different sputtering atmospheres in different zones, so that each substrate is coated with a plurality of films in succession as it moves through these different zones. Processes in accordance with the invention may be conducted in some of these zones, whereas other deposition processes, not in accordance with the invention, may be conducted in other zones.

An oxide film may be deposited on substantially any substrate by a process in accordance with the invention. In conventional sputtering processes, the composition of the substrate will influence the degree of adhesion between the deposited film and the substrate. The same considerations apply in processes according to the invention. Also, the substrate treated in a process according to the invention may include one or more thin films on the surface, so that the oxide film is deposited in accordance with the invention atop these other films.

The target may incorporate more than one of the preferred metals or metalloids, i.e., a mixture, alloy or mosaic of more than one Si, Al, Ti, and Sn. In this case, the oxide film normally will incorporate all of the metals and metalloids in the target. However, the metals and metalloids will not necessarily be present in the deposited film in the exact proportions as supplied in the target. Also, the target may include oxygen, chlorine or both, typically as oxides or chlorides of the metals or metalloids. Although other elements may be included in the target, a target consisting essentially of the aforementioned preferred metals or metalloids with or without oxygen or chlorine is preferred. Most preferably, the target consists essentially of the preferred metals or metalloids mentioned above. The plasma-forming gas may also contain elements other than those specifically mentioned above. In particular, the plasma-forming gas may itself include one or more metals or metalloids. Thus, the chlorine-containing gas constituent may include a volatile metal chloride such as $TiCl_4$. The metal or metalloid from the plasma-forming gas may be co-deposited in the oxide film with the metal or metalloid from the target. The metal or metalloid deposited in the plasma-forming gas may be the same or different from the metal or metalloid in the target.

The following examples illustrate certain aspects of the present invention:

EXAMPLE I

A silicon target is mounted in sputtering apparatus generally in accordance with FIG. 1, of the type sold under the designation ESM 100 by the Edwards High Vacuum company of Crawley, England. The gas inlet of the chamber is connected to a gas supply apparatus including a source of $O_2$ and a source of $CCl_4$. The sputtering apparatus is operated with RF power of 170 Watts, corresponding to about 2.5 watts/cm² power input based on total target area. The pressure in the chamber is maintained at about 6 mTorr, and the substrate temperature is maintained at about 30° C. The gas sources are adjusted to provide different plasma-forming gasses on different runs. In each run, a film is deposited on a glass substrate and subsequently analyzed. The results are as set forth in Table II below:

TABLE II

| Run | Gas Composition (mole % $O_2$) mole % $CCl_4$ | Deposition Rate, Angstroms/ Second | Atomic % Chlorine in Film |
| --- | --- | --- | --- |
| Control | 100/0 | 1 | 0 |

TABLE II-continued

| Run | Gas Composition (mole % $O_2$) mole % $CCl_4$ | Deposition Rate, Angstroms/ Second | Atomic % Chlorine in Film |
| --- | --- | --- | --- |
| (not in accordance with the invention) | | | |
| A | 80/20 | 3 | Less than 2 |
| B | 55/45 | 16 | Less than 2 |
| C | 50/50 | 24 | Less than 2 |
| D | 47/53 | 27 | Less than 2 |
| E | 45/55 | 29 | Less than 2 |
| F | 40/60 | 27 | Less than 2 |
| G | 35/65 | 27 | Less than 2 |

These results demonstrate a 29-fold increase in the deposition rate while maintaining acceptable film quality.

EXAMPLE II

A Ti target is sputtered using the same apparatus as in Example I, but with DC power to supply about 200 Watts sputtering power. The gas supply apparatus is arranged to provide a mixture of $O_2$, Ar and $CCl_4$. The $O_2$ concentration is maintained at about 30 mole %, whereas the $CCl_4$ concentration is varied on successive runs. The index of refraction of the deposited film for light of 633 nm wavelength is measured.

The results are indicated in Table III.

TABLE III

| Run | $CCl_4$ in Plasma-forming Gas (mole %) | Deposition Rate Angstroms/ Second | Index of Refraction |
| --- | --- | --- | --- |
| Control (not in accordance with the invention) | 0 | 0.4 | 2.3 |
| A | 6 | 1.0 | 2.3 |
| B | 10 | 3.5 | 2.3 |
| C | 15 | 3.0 | 2.2 |
| D | 20 | 1.9 | 2.1 |
| E | 25 | 0.2 | 2.0 |

These results indicate that a high-quality, high index $TiO_2$ film was deposited approximately 8 times faster in a process according to the invention. Under experimental high humidity and high temperature conditions commonly used to test $TiO_2$ films for resistance to atmospheric moisture, Sample B performs as well as the control. Sample B provides scratch resistance equal to the control.

EXAMPLE III

An Al target is sputtered in a chamber of the type commercially available under the designation ILS-1600 from AIRCO Solar Products of Fairfield, Calif. utilizing DC power at about 2.0 k Watts. In a control process not in accordance with the invention, using a plasma-forming gas of 100 mole % $O_2$, $Al_2O_3$ is deposited at an energy-based deposition yield of 90 mm² Å/J. In a test process according to the invention with a plasma-forming gas of 90 mole % $O_2$ and 10 mole % $CCl_4$, the energy-based deposition yield is 190 mm² Å/J and the deposited film contains about 4 atomic percent chlorine.

EXAMPLE IV

A Sn target is treated as in the control and test processes of Example III, except that DC power at about 2.0 k Watts is employed. In the control process, $SnO_2$ is deposited at an energy-based deposition yield of about 2000 mm$^2$ Å/J. In the test process, SnO$_2$ containing about 4 atomic % Cl is deposited at about 5800 mm$^2$ Å/J.

As numerous variations and combinations of the features as described above can be utilized without departing from the present invention as defined by the claims, the foregoing description of the preferred embodiments should be taken by way of illustration rather than by way of limitation of the invention.

I claim:

1. A method of making an oxide film comprising the steps of providing a target including a metal or metalloid element selected from the group consisting of Si, Ti, Al, Sn and combinations thereof, providing a substrate in proximity to said target, exposing a surface of said target to a plasma containing oxygen and chlorine and maintaining said target at a sputtering potential with respect to said plasma so that material is dislodged from said exposed target surface and deposited on said substrate.

2. A method as claimed in claim 1 wherein said target consists essentially of said metal or metalloid element and combinations thereof.

3. A method as claimed in claim 2 wherein said metal or metalloid element is a single element selected from the group consisting of Si, Ti, Al, and Sn.

4. A method as claimed in claim 1 wherein said metal or metalloid element is Si.

5. A method as claimed in claim 1 wherein said metal or metalloid element is Ti.

6. A method as claimed in claim 1 wherein said step of exposing said target to a plasma includes the steps of supplying a plasma-forming gas including oxygen and chlorine and converting said gas to said plasma.

7. A method as claimed in claim 6 wherein said plasma-forming gas includes a first gaseous species containing oxygen and a second gaseous species containing chlorine, the method further comprising the step of controlling the proportion of chlorine to oxygen in said plasma by controlling the proportion of said first and second species in said plasma-forming gas.

8. A method as claimed in claim 7 wherein said chlorine-containing species includes a compound containing both carbon and chlorine.

9. A method as claimed in claim 8 wherein said compound is selected from the group consisting of chlorinated hydrocarbons having fewer than 4 carbon atoms.

10. A method as claimed in claim 8 wherein said compound is CCl$_4$.

11. A method as claimed in claim 7 wherein said oxygen-containing species is O$_2$.

12. A method as claimed in claim 7 wherein said plasma-forming gas further includes a noble gas.

13. A method as claimed in claim 12 wherein said noble gas is argon.

14. A method as claimed in claim 6 wherein said plasma-forming gas is substantially free of fluorine.

15. A method as claimed in claim 6 wherein said plasma-forming gas is substantially free of hydrogen.

16. A method as claimed in claim 1 further comprising the step of substantially isolating said substrate from said plasma.

17. A method as claimed in claim 1 further comprising the step of maintaining a film of an oxide of said metal or metalloid element on said exposed surface of said target during said step of exposing said target to said plasma.

* * * * *